(12) United States Patent
Song et al.

(10) Patent No.: US 11,817,447 B2
(45) Date of Patent: Nov. 14, 2023

(54) ELECTROSTATIC DISCHARGE PROTECTION ELEMENT AND SEMICONDUCTOR DEVICES INCLUDING THE SAME

(71) Applicant: Samsung Electronics Co., Ltd., Suwon-si (KR)

(72) Inventors: Sungjun Song, Hwaseong-si (KR); Hyunkwang Jeong, Hwaseong-si (KR); Changsu Kim, Hwaseong-si (KR); Chanhee Jeon, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 86 days.

(21) Appl. No.: 16/986,533

(22) Filed: Aug. 6, 2020

(65) Prior Publication Data
US 2021/0175226 A1 Jun. 10, 2021

(30) Foreign Application Priority Data

Dec. 10, 2019 (KR) .................. 10-2019-0164000
Apr. 28, 2020 (KR) .................. 10-2020-0051163

(51) Int. Cl.
*H01L 27/02* (2006.01)

(52) U.S. Cl.
CPC ...... *H01L 27/0277* (2013.01); *H01L 27/0274* (2013.01); *H01L 27/0285* (2013.01)

(58) Field of Classification Search
CPC ............. H01L 27/0277; H01L 27/0274; H01L 27/0285; H01L 27/0248; H01L 27/0266; H01L 27/0296; H01L 29/0847; H01L 29/78
See application file for complete search history.

(56) References Cited

U.S. PATENT DOCUMENTS

| 5,451,799 | A | * | 9/1995 | Kurimoto | ......... H01L 29/41758 |
| | | | | | 257/241 |
| 5,455,436 | A | * | 10/1995 | Cheng | ................. H01L 27/0262 |
| | | | | | 257/362 |
| 8,551,835 | B2 | | 10/2013 | Sheu et al. | |
| 8,755,157 | B2 | | 6/2014 | Son et al. | |
| 9,337,077 | B2 | | 5/2016 | Sakurai et al. | |

(Continued)

FOREIGN PATENT DOCUMENTS

| CN | 102983133 A | * 3/2013 |
| KR | 10-0914680 B1 | 9/2009 |
| KR | 10-1944189 B1 | 4/2019 |

*Primary Examiner* — Bitew A Dinke
(74) *Attorney, Agent, or Firm* — Harness, Dickey & Pierce, P.L.C.

(57) ABSTRACT

A semiconductor device includes a substrate including a P-well region, a gate electrode on the substrate, and a first region and a second region formed in the substrate on opposite sides adjacent to the gate electrode, the first region includes a first N-well region in the substrate and a second N-well region, a first impurity region, a second impurity region in the first N-well region, the second region includes a third impurity region in the substrate and a fourth impurity region in the third impurity region, a doping concentration of the second N-well region is greater than a doping concentration of the first N-well region, and a doping concentration of the second impurity region is greater than a doping concentration of the second N-well region.

20 Claims, 16 Drawing Sheets

(56) References Cited

U.S. PATENT DOCUMENTS

| | | | |
|---|---|---|---|
| 9,431,389 B2 | 8/2016 | Hwang et al. | |
| 9,472,511 B2 * | 10/2016 | Lee | H01L 29/8611 |
| 9,607,980 B1 * | 3/2017 | Wang | H01L 29/66681 |
| 10,128,331 B1 * | 11/2018 | Wu | H01L 29/0646 |
| 10,340,266 B2 | 7/2019 | Solaro et al. | |
| 11,217,691 B2 * | 1/2022 | Ningaraju | H01L 29/1095 |
| 2007/0052031 A1 | 3/2007 | Kinoshita | H01L 27/0251 |
| | | | 257/E21.438 |
| 2008/0237747 A1 * | 10/2008 | Hayashi | H01L 23/585 |
| | | | 257/E29.267 |
| 2010/0213545 A1 * | 8/2010 | Kho | H01L 29/7833 |
| | | | 257/E29.256 |
| 2011/0169093 A1 * | 7/2011 | Kim | H01L 29/861 |
| | | | 257/361 |
| 2011/0233673 A1 * | 9/2011 | Liu | H01L 29/66689 |
| | | | 438/286 |
| 2011/0292553 A1 * | 12/2011 | Son | H01L 27/027 |
| | | | 257/E29.256 |
| 2012/0175673 A1 * | 7/2012 | Lee | H01L 29/7816 |
| | | | 257/140 |
| 2012/0199878 A1 * | 8/2012 | Shrivastava | H01L 29/1095 |
| | | | 438/286 |
| 2013/0049112 A1 * | 2/2013 | Lai | H01L 29/0847 |
| | | | 257/E29.256 |
| 2013/0056825 A1 * | 3/2013 | Chen | H01L 21/26586 |
| | | | 438/306 |
| 2013/0146979 A1 | 6/2013 | Nandakumar et al. | |
| 2013/0207179 A1 * | 8/2013 | Lai | H01L 29/0847 |
| | | | 257/328 |
| 2014/0175552 A1 * | 6/2014 | Sakurai | H01L 27/0921 |
| | | | 257/355 |
| 2014/0210003 A1 * | 7/2014 | Ko | H01L 27/0629 |
| | | | 438/237 |
| 2016/0240660 A1 * | 8/2016 | Yue | H01L 29/1087 |
| 2016/0358904 A1 * | 12/2016 | Lin | H01L 27/0274 |
| 2017/0236816 A1 * | 8/2017 | Tsai | H01L 29/87 |
| | | | 257/112 |
| 2018/0006012 A1 * | 1/2018 | Huang | H01L 23/5286 |
| 2018/0076201 A1 * | 3/2018 | Toyoda | H01L 29/7835 |
| 2018/0114787 A1 * | 4/2018 | Lin | H01L 29/0653 |
| 2018/0374838 A1 * | 12/2018 | Huang | H01L 29/0847 |

* cited by examiner

ELECTROSTATIC DISCHARGE PROTECTION ELEMENT AND SEMICONDUCTOR DEVICES INCLUDING THE SAME

CROSS-REFERENCE TO RELATED APPLICATION(S)

This application claims benefit of priority to Korean Patent Application Nos. 10-2020-0051163 filed on Apr. 28, 2020 and 10-2019-0164000 filed on Dec. 10, 2019 in the Korean Intellectual Property Office, the disclosures of which are incorporated herein by reference in their entirety.

BACKGROUND

The present disclosure relates to an electrostatic discharge protection layer and a semiconductor device including the same.

Electrostatic discharge (ESD) protection devices are installed to reduce or prevent product destruction or deterioration caused by static electricity. When a semiconductor integrated circuit is in contact with a human body or machine, static electricity generated from the human or the machine may be discharged into a semiconductor device through an external pin by way of an input/output pad. Thus, electrostatic current may flow to a semiconductor internal circuit to potentially significantly damage the semiconductor circuit.

SUMMARY

Example embodiments provide an electrostatic discharge (ESD) protection device, which may more uniformly distribute discharge current to decrease a temperature of a junction portion and may provide improved electrostatic characteristics even with a small area, and a semiconductor device including the ESD protection device.

According to example embodiments, a semiconductor device includes a substrate, a separation region in the substrate, an electrostatic discharge protection element, an internal integrated circuit electrically connected to the electrostatic discharge protection element, and a first pad and a second pad electrically connected to the electrostatic discharge protection element and the internal integrated circuit. The electrostatic discharge protection element includes a P-well region in the substrate, a gate electrode having a first side surface and a second side surface, opposing each other, on the substrate, a gate dielectric layer between the gate electrode and the substrate, a first region adjacent to the first side surface of the gate electrode in the substrate, and a second region adjacent to the second side surface of the gate electrode in the substrate. The first region and the second region have N-type conductivity. The first region includes a first N-well region in the substrate, a second N-well region in the first N-well region, a first impurity region overlapping the second N-well region in the first N-well region in a vertical direction, and a second impurity region in the first impurity region. The second region includes a third impurity region in the substrate and a fourth impurity region in the third impurity region. The vertical direction is perpendicular to an upper surface of the substrate. A distance between the upper surface of the substrate and a lower surface of the second N-well region is greater than a distance between the upper surface of the substrate and a lower surface of the separation region.

According to example embodiments, a semiconductor device includes a substrate including a P-well region, a gate electrode on the substrate, and a first region and a second region formed in the substrate on opposite sides adjacent to the gate electrode. The first region includes a first N-well region in the substrate and a second N-well region, a first impurity region, and a second impurity region in the first N-well region. The second region includes a third impurity region in the substrate and a fourth impurity region in the third impurity region. A doping concentration of the second N-well region is greater than a doping concentration of the first N-well region. A doping concentration of the second impurity region is greater than a doping concentration of the second N-well region.

According to example embodiments, a semiconductor device includes an electrostatic discharge protection element and an internal integrated circuit electrically connected to the electrostatic discharge protection element. The electrostatic discharge protection element includes a P-well region in a substrate, a gate electrode on the substrate, and a first region and a second region formed in the substrate on opposite sides adjacent to the gate electrode. The first region includes a first N-well region in the substrate and a second N-well region, a first impurity region, and a second impurity region in the first N-well region. The second region includes a third impurity region in the substrate and a fourth impurity region in the third impurity region. The electrostatic discharge protection element includes a plurality of parasitic BJTs. In the plurality of parasitic BJTs, the P-well region operates as a base and the second region operates as a collector. The plurality of parasitic BJTs include at least one first parasitic BJTs allowing current to flow from the first N-well region to the second region by operating the first N-well region as a collector, at least one second parasitic BJTs allowing current to flow from the first impurity region to the second region by operating the first impurity region as a collector, and at least one third parasitic BJTs allowing current to flow from the second N-well region to the second region by operating the second N-well region as a collector.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
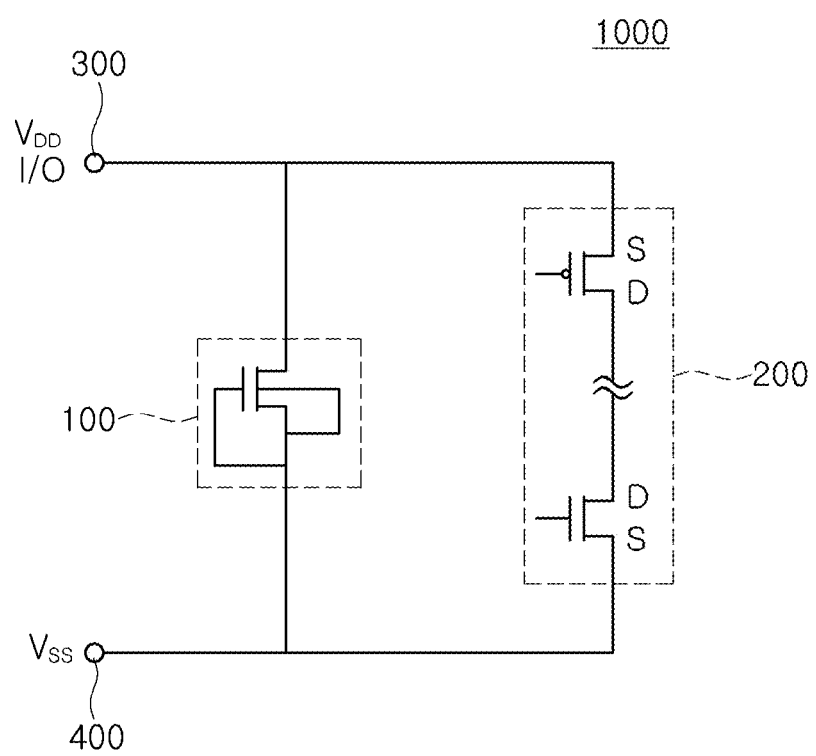
FIG. 1 is a block diagram of a semiconductor device including an electrostatic discharge protection element according to example embodiments.

Referring to FIG. 1, a semiconductor device 1000 may include a substrate 101, an electrostatic discharge protection element 100, an internal integrated circuit 200, a first pad 300, and/or a second pad 400. The first pad 300 may be a power voltage pad and/or an input/output pad. The second pad 400 may be a ground voltage pad.

When static electricity is introduced into the first pad 300, electrostatic current caused by the static electricity may flow into the electrostatic discharge protection element 100. The electrostatic discharge protection element 100 may be selectively turned on by the static electricity introduced into the first pad 300. As the electrostatic discharge protection element 100 is turned on, the electrostatic current may flow to the electrostatic discharge protection element 100 and the electrostatic current, flowing into the internal integrated circuit 200, may be potentially significantly reduced. Thus, the internal integrated circuit 200 may be reduced or prevented from being damaged by electrostatic current. The electrostatic discharge protection element 100 may protect a high-voltage element, used in a power clamp terminal, from the static electricity.

When the static electricity flows into a drain region, a voltage of the drain region may be increased and avalanche breakdown may occur due to a reverse bias between the drain region and a body. A hole of an electron hole pair (EHP), generated by the avalanche breakdown, flows into the body, so that a voltage drop may occur due to parasitic resistance to increase a voltage of the body. When a voltage rises until a P-N junction between the body and a source region is turned on by a forward bias, a parasitic N-P-N bipolar junction transistor (BJT) may be turned on, so that the electrostatic current may flows to a ground terminal to discharge the electrostatic current. The ground terminal may be a single ground terminal to which a gate electrode, a source region, and the body are connected.

The electrostatic discharge protection element 100 may be maintained in an OFF state during a normal operation, in which static electricity of a circuit, or the like, is not introduced, and may have no effect on an operation of the internal integrated circuit 200. When the static electricity is introduced into an input/output pad and/or a power supply voltage pad, the electrostatic discharge protection element 100 may be turned on to provide an electrostatic discharge path. Current, generated from the static electricity, may flow through the static discharge path. As a result, the internal integrated circuit 200 may be protected from the current generated from the static electricity.

The electrostatic discharge protection element 100 may include a MOS transistor, diode, or a silicon controlled rectifier (SCR).

In example embodiments illustrated in FIG. 1, the electrostatic discharge protection element 100 may be a gate grounded NMOS (GGNMOS), a structure in which a gate electrode, a source region, and a body are connected to a ground voltage pad. However, according to example embodiments, the electrostatic discharge protection element 100 may be implemented as a gate coupled NMOS (GCNMOS), a soft Gate coupled NMOS (SGCNMOS), or the like.

The semiconductor device 1000 may a device performing various functions. For example, the semiconductor device 1000 may be a memory device or a display driver IC. When the semiconductor device 1000 is a memory device, the internal integrated circuit 200 may be a memory controller controlling a memory operation. The internal integrated circuit 200 may include a peripheral circuit of a memory cell array and may receive a control signal to control memory cells included in the memory cell array. For example, the internal integrated circuit 200 may be a memory including cells, each storing data therein. The internal integrated circuit 200 may include a plurality of transistors including source/drain regions S and D. When the semiconductor device 1000 is a display driver IC, the electrostatic discharge protection element 100 may be connected to the internal integrated circuit 200, including a source driver, a gate driver, and the like, to protect the source driver, the gate driver, and the like, from the static electricity.

Figure 2A:
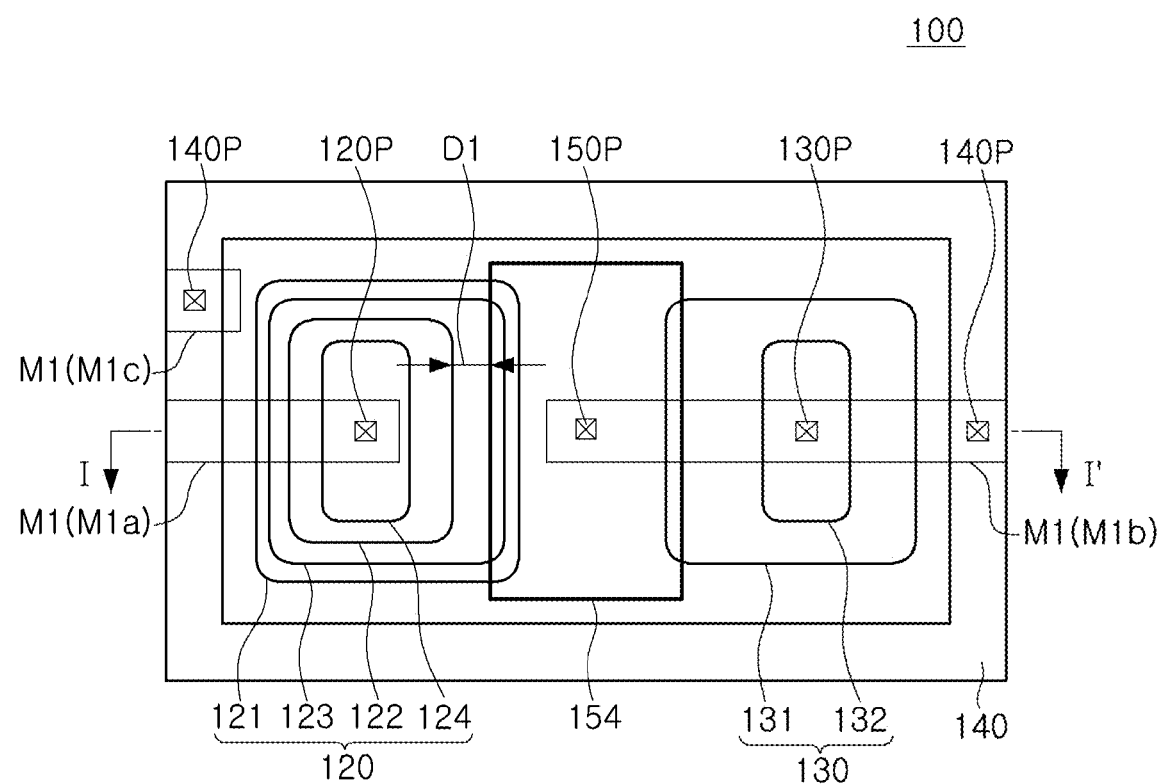
FIG. 2A is a plan view of an electrostatic discharge protection element according to example embodiments.

FIG. 2A is a plan view of an electrostatic discharge protection element according to example embodiments.

Figure 2B:
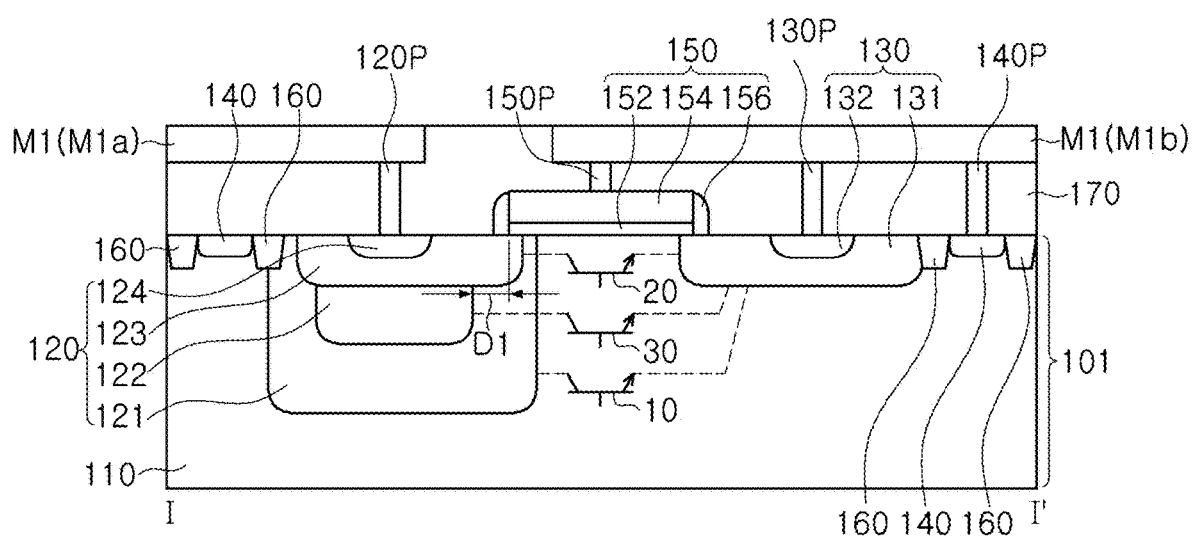
FIG. 2B is a cross-sectional view of an electrostatic discharge protection element according to example embodiments.

FIG. 2B is a cross-sectional view of an electrostatic discharge protection element according to example embodiments. FIG. 2B illustrates a cross section of the electrostatic discharge protection element, taken along line I-F in FIG. 2A.

Referring to FIGS. 2A and 2B, the electrostatic discharge protection element 100 may include a substrate 101 and a gate structure 150 on the substrate 101. The substrate 101 may include a P-well region 110, a first region 120 and/or a second region 130 and P, respectively disposed on opposite sides adjacent to the gate structure 150 in the P-well region 110, and a first impurity region 140 may be included. The gate structure 150 may include a gate dielectric layer 152, a gate electrode 154, and/or a spacer 156.

The substrate 101 may have an upper surface extending in an X direction and a Y direction. The substrate 101 may include a semiconductor material such as a group IV semiconductor, a group III-V compound semiconductor, or a group II-VI compound semiconductor. For example, the group IV semiconductor may include silicon (Si), germanium (Ge), or silicon germanium (SiGe). The substrate 101 may be provided as a bulk wafer, a silicon-on-insulator (SOI) layer, or a semiconductor on insulator (SeOI) layer.

The P-well region 110 may be a region formed by implanting P-type impurities into one region of the substrate 101. The P-type impurity may be, for example, boron (B), aluminum (Al), or the like. The P-well region 110 may be provided as a body of a MOS transistor in the electrostatic discharge protection element 100.

The first region 120 may include a first N-well region 121, a second N-well region 122, a first impurity region 123, and/or a second impurity region 124. Each of the first N-well region 121, the second N-well region 122, the first impurity region 123, and/or the second impurity region 124 may have N-type conductivity. The first N-well region 121, the second N-well region 122, the first impurity region 123, and/or the second impurity region 124 may be regions formed by implanting N-type impurities in one region of the P-well region of the substrate 101, respectively. The N-type impurity may be, for example, phosphorus (P), arsenic (As), or the like.

In some example embodiments, the first N-well region 121, the second N-well region 122, the first impurity region 123, and the second impurity region 124 may have different doping concentrations. For example, the doping concentration of the second impurity region 124 may be greater than the doping concentration of the first impurity region 123. The doping concentration of the second impurity region 124 may be greater than the doping concentration of the second N-well region 122. The doping concentration of the second impurity region 124 may be greater than the doping concentration of the first N-well region 121. For example, the doping concentration of the first impurity region 123 may be greater than the doping concentration of the second N-well region 122. The doping concentration of the first impurity region 123 may be greater than the doping concentration of the first N-well region 121. For example, the doping concentration of the second N-well region 122 may be greater than the doping concentration of the first N-well region 121.

In some example embodiments, the second impurity region 124 may be heavily doped with $N^+$-type impurities to have a relatively high doping concentration, and the first impurity region 123 may be lightly doped with $N^-$-type impurities to have a relatively low doping concentration.

In some example embodiments, impurity concentrations of the first N-well region 121, the second N-well region 122, the first impurity region 123, and/or the second impurity region 124 may be increased in a direction toward the upper surface of the substrate 101.

In an example embodiment, each of the first N-well region 121 and the second N-well region 122 may include a plurality of regions having different doping concentrations to each other. Each of the first N-well region 121 and the second N-well region 122 may have a concentration gradient in which a doping concentration is decreased in a direction toward the P-well region 110.

In some example embodiments, the first impurity region 123 and the second impurity region 124 may be formed in the first N-well region 121. The first impurity region 123 and the second impurity region 124 may be disposed on the second N-well region 122. Unlike what is illustrated in FIG. 3, the first impurity region 123 and the second impurity region 124 may be formed in the second N-well region 122. The second N-well region 122 may be formed in the first N-well region 121. The second N-well region 122 may be formed in a region having a relatively low doping concentration in the first N-well region 121.

In some example embodiments, the first impurity region 123 may overlap the second N-well region 122 in the first N-well region 121 in a vertical direction. The second impurity region 124 may overlap the second N-well region 122 in the first N-well region 121 in the vertical direction. The vertical direction may be a direction perpendicular to the upper surface of the substrate 101.

In some example embodiments, the first N-well region 121 and the second N-well region 122 may provide a deep junction region. The deep junction region may extend downwardly of a lower portion the gate structure 150 and a lower portion of the separation region 160. Since the first N-well region 121 and the second N-well region 122 provide the deep junction region, an area of the first region 120 may be increased.

In some example embodiments, a width of the second N-well region 122 may be less than a width of the first N-well region 121 and may be less than a width of the first impurity region 123. The second N-well region 122 may or may not overlap the gate electrode 154 in the vertical direction.

In some example embodiments, a side surface of the second N-well region 122 adjacent to the gate electrode 154 may have a spacing distance D1 from a first side surface of the gate electrode 154 adjacent to the second N-well region 122 in a horizontal direction, when viewed from above. The horizontal direction may be a direction parallel to the upper surface of the substrate 101. The first spacing distance D1 may be variously changed according to example embodiments. Accordingly, characteristics of the electrostatic discharge protection element 100 may also be variously changed.

The second region 130 may include a third impurity region 131 and/or a fourth impurity region 132. Each of the third impurity region 131 and the fourth impurity region 132 may have N-type conductivity. The third impurity region 131 and/or the fourth impurity region 132 may be regions formed by implanting N-type impurities into one region of the P-well region 110 of the substrate 101, respectively.

In some example embodiments, the third impurity region 131 and/or the fourth impurity region 132 may have different doping concentrations to each other. For example, the doping concentration of the third impurity region 131 may be lower than the doping concentration of the fourth impurity region 132. For example, the doping concentration of the fourth impurity region 132 may be greater than the doping concentration of the third impurity region 131. The doping concentration of the third impurity region 131 may be greater than the doping concentration of the first N-well region 121 and the doping concentration of the second N-well region 122. The doping concentration of the fourth impurity region 132 may be greater than the doping concentration of the first N-well region 121 and the doping concentration of the second N-well region 122.

In some example embodiments, the fourth impurity region 132 may be heavily doped with $N^+$-type impurities to have a relatively high doping concentration, and the third impurity region 131 may be lightly doped with $N^-$-type impurities to have a relatively low doping concentration.

In some example embodiments, impurity concentrations of the third impurity region 131 and the fourth impurity region 132 may be increased in a direction toward the upper surface of the substrate 101.

In some example embodiments, each of the third impurity region 131 and/or the fourth impurity region 132 may include a plurality of regions having different doping concentrations to each other. Each of the third impurity region 131 and the fourth impurity region 132 may have a concentration gradient in which a doping concentration is decreased in a direction toward the P-well region 110.

In some example embodiments, the third impurity region 131 and the fourth impurity region 132 may be formed in the P-well region 110.

In some example embodiments, a portion of the third impurity region 131 may overlap a separation region 160 in a vertical direction.

In some example embodiments, the fourth impurity region 132 may be in contact with a side surface of the separation region 160.

A depth of the first region 120 from the upper surface of the substrate 101 may be larger than a depth of the second region 130 from the upper surface of the substrate 101. A depth of the third impurity region 131 from the upper surface of the substrate 101 may be less than a depth of the second N-well region 122 from the upper surface of the substrate 101.

One side surface of the first impurity region 123 adjacent to the gate electrode 154 may be spaced apart from the second region 130 at a first interval, and one side surface of the second N-well region 122 adjacent to the gate electrode 154 may be spaced apart from the second region 130 at a second interval greater than the first interval.

The P-type impurity region 140 may be formed in the P-well region 110. The P-type impurity region 140 may be regions formed by implanting P-type impurities into one region of the P-well region 110 of the substrate 101. The P-type impurity may be, for example, boron (B), aluminum (Al), or the like.

In some example embodiments, the P-well region 110 and/or the P-type impurity region 140 may have different doping concentrations to each other. For example, the doping concentration of the P-well region 110 may be lower than the doping concentration of the P-type impurity region 140.

In some example embodiments, the impurity concentration of the P-well region and/or the P-type impurity region 140 may be increased in a direction toward the upper surface of the substrate 101.

In some example embodiments, each of the P-well region 110 and the P-type impurity region 140 may include a plurality of regions having different doping concentrations to each other.

In some example embodiments, the P-type impurity region 140 may be disposed on at least one side of the first region 120 and at least one side of the second region 130. The P-type impurity region 140 may be separated from the first region 120 and/or the second region 130 by the separation region 160.

The gate structure 150 may include a gate dielectric layer 152, a gate electrode 154, and/or spacers 156. The gate structure 150 may be disposed to extend in one direction.

In some example embodiments, the gate dielectric layer 152 may be disposed between the substrate 101 and the gate electrode 154. The gate electrode 154 may be disposed on the gate dielectric layer 152. The spacers 156 may be disposed on opposite sides adjacent to the gate electrode 154 and may extend in a direction perpendicular to the upper of the substrate 101. The spacer 156 may insulate the first region 120 and the second region 130 from the gate electrode 154.

In some example embodiments, the gate dielectric layer 152 may include an oxide, a nitride, or a high-k material. The high-k material may refer to a dielectric material having a higher dielectric constant than a silicon oxide ($SiO_2$). The high-k material may include, for example, aluminum oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

In some example embodiments, the gate electrode 154 may have a first side surface and a second side surface, opposing each other, on the substrate 101. The gate electrode 154 may include a conductive material. The gate electrode 154 may include, for example, metal nitride such as titanium nitride (TiN), tantalum nitride (TaN), or tungsten nitride (WN), and/or aluminum (Al), tungsten (W), or molybdenum (Mo)), or a semiconductor material such as doped polysilicon. The gate electrode 154 may have a multilayer structure including two or more layers.

In some example embodiments, the gate electrode 154 may have a greater width than a width of a circuit gate electrode 254 of a transistor TR (see FIG. 7B) of the internal integrated circuit 200. The gate electrode 154 may have a width of, for example, about 600 μm, but the width of the gate electrode 154 is not limited thereto.

In some example embodiments, the spacer 156 may be formed of an oxide, a nitride, and an oxynitride and, particularly, may be formed of a low-k material. The spacer 156 may be formed to have a multilayer structure according to example embodiments.

The electrostatic discharge protection element 100 may further include a separation region 160, an interlayer insulating layer 170, and/or contact plugs 120P, 130P, 140P, and 150P.

The separation region 160 may separate the first region 120 and the P-type impurity region 140 from each other. The separation region 160 may separate the second region 130 and the P-type impurity region 140 from each other. The separation region 160 may be formed of an insulating material. The separation region 160 may include, for example, an oxide, a nitride, or a combination thereof.

The separation region 160 may overlap a portion of the first N-well region 121 in the vertical direction. In some example embodiments, the separation region 160 may overlap a portion of the first impurity region 123 in the vertical direction. In example embodiments, the first impurity region 123 may be in contact with a side surface of the separation region 160.

A disposition of a lower surface of the separation region 160 is not limited to that illustrated in the drawing, and may be variously changed according to example embodiments. For example, the lower surface of the separation region 160 may extend downwardly of a portion of the lower surface of the first impurity region 123.

A distance between the upper surface of the substrate 101 and a lower surface of the first N-well region 121 may be greater than a distance between the upper surface of the substrate 101 and a lower surface of the separation region 160. A distance between the upper surface of the substrate 101 and a lower surface of the second N-well region 122 may be larger than the distance between the upper surface of the substrate 101 and the lower surface of the separation region 160. A distance between the upper surface of the substrate 101 and the lower surface of the first impurity region 123 may be larger than the distance between the upper surface of the substrate 101 and the lower surface of the separation region 160.

In some example embodiments, the separation region 160 may be formed to surround an active region including the first region 120 and the second region 130. As an example, the separation region 160 may have a rectangular shape surrounding at least one side of the first region 120 and surrounding at least one side of the second region 130. The separation region 160 may be disposed in the substrate 101 to surround edges of the first region 120 and the second region 130. In example embodiments, the gate structure 150 may be disposed on one region inside of the separation region 160.

In some example embodiments, the separation region 160 may have a rectangular shape surrounding at least one side of the P-type impurity region 140. The separation region 160 may be disposed in the substrate 101 to surround the edge of the P-type impurity region 140.

The interlayer insulating layer 170 may be disposed to cover upper surfaces of the first region 120, the second region 130, the separation region 160, and/or the gate structure 150. The interlayer insulating layer 170 may include, for example, at least one of an oxide, a nitride, and an oxynitride, and may include a low-k material.

Contact plugs 120P, 130P, 140P, and/or 150P may penetrate through the interlayer insulating layer 170. The contact plugs 120P, 130P, 140P, and/or 150P include a first contact plug 120P electrically connected to the first region 120, a second contact plug 130P electrically connected to the second region 130, and a third contact plug 140P electrically connected to the P-type impurity region 140, and a fourth contact plug 150P electrically connected to the gate electrode 154 of the gate structure 150.

Each of the contact plugs 120P, 130P, 140P, and 150P may include a metal-semiconductor compound layer, a conductive barrier layer, and a conductive layer surrounded by the conductive barrier layer. The metal-semiconductor compound layer may be formed of a material such as CoSi, NiSi or TiSi. The conductive barrier layer may be formed of a metal nitride such as TiN, TaN or WN. The conductive layer may be formed of tungsten (W), cobalt (Co), titanium (Ti), alloys thereof, or combinations thereof. The first region 120 may be electrically connected to an input/output pad and/or a power pad through the first contact plug 120P. A power supply voltage $V_{DD}$ may be applied to the first region 120 through the first contact plug 120P.

The second to fourth contact plugs 130P, 140P, and 150P may be electrically connected to a ground power pad. A ground voltage $V_{SS}$ may be applied to the second region 130, the P-well region 110, and the gate electrode 154 through the second to fourth contact plugs 130P, 140P, and 150P.

The electrostatic discharge protection element 100 may include a first metal line M1a, electrically connected to the first region 120 through the first contact plug 120P on the substrate 101, and a second metal line M1b commonly connected to the second to fourth contact plugs 130P, 140P, and 150P on the substrate 101 and electrically connected to the second region 130, the P-type impurity region 140, and/or the gate electrode 154.

The first metal line M1a may be disposed on the first contact plug 120P and may extend in one direction. The first metal line M1a may be electrically connected to the first pad 300 (see FIG. 1). The first pad 300 may be an input/output pad and/or a power pad. In this case, when static electricity is generated in the first pad 300, the first metal line M1a may allow current generated by the static electricity to flow from the first pad 300 to the first region 120, and thus, the electrostatic discharge protection element 100 may operate.

The second metal line M1b may be disposed on the second to fourth contact plugs 130P, 140P, and 150P, and may extend in one direction. The second metal line M1b may be electrically connected to the second pad 400 (see FIG. 1). A ground voltage $V_{SS}$ may be applied to the second region 130, the P-type impurity region 140, and the gate electrode 154 through the second metal line M1b.

In some example embodiments, the electrostatic discharge protection element 100 may further include a third metal line M1c electrically connected to the third contact plug 140P to apply the ground voltage $V_{CC}$ to the P-type impurity region 140. According to example embodiments, more third contact plugs 140P and third metal lines M1c may be disposed than is illustrated in the drawings.

In the electrostatic discharge protection element 100, the first region 120 and the P-well region 110 are reversely biased when static electricity having a positive level is generated in the first region 120. When a voltage of the first region 120 reaches an avalanche breakdown voltage due to the static electricity, current may flow from the first region 120 to the P-well region 110 of the electrostatic discharge protection element 100. In example embodiments, a voltage of the P-well region 110 may be increased by current introduced from the first region 120.

The P-well region 110, the first region 120, and the second region 130 of the electrostatic discharge protection element 100 may form an N-P-N junction. When the voltage of the first region 120 is increased by the static electricity and the voltage of the P-well region 110 is increased by current introduced from the first region 120, a bias condition, in which the P-well region 110, the first region 120, and the second region 130 of the electrostatic discharge protection element 100 operate as an N-P-N BJT, may be satisfied.

For example, the second region 130 of the electrostatic discharge protection element 100 may operate as an emitter of the N-P-N BJT, the P-well region 110 may operate as a base, and the first region 120 may operate as a collector. Current may flow from the first region 120 to the second region 130 of the electrostatic discharge protection element 100, based on a difference in voltage between the P-well region 110 and the second region 130 of the electrostatic discharge protection element 100.

When the current flows from the first region 120 to the second region 130 of the electrostatic discharge protection element 100, a distribution of current density may be affected by a concentration of impurities distributed on a side surface of the first region 120 adjacent to the P-well region 110. For example, when the side surface of the first region 120 adjacent to the P-well region 110 have a more uniform distribution of impurity concentration depending on depth, current introduced from the first region 120 by the static electricity may be vertically and more uniformly distributed and flow to the second region 130. For example, since the current may flow while being distributed, heat generation caused by current concentration (Joule heating) may be reduced or prevented to decrease a temperature in a junction region of the first region 120. Accordingly, the electrostatic discharge protection element 100 may be not deteriorated. As a result, an electrostatic discharge protection element having improved electrostatic discharge robustness characteristics may be provided.

According to the present inventive concepts, the electrostatic discharge protection element 100 may further include a second N-well region 122 in the first N-well region 121, a deep junction region, such that a side surfaced of the first region 120 may have a more uniform impurity concentration distribution according to depth. Accordingly, current density may be reduced or prevented from being locally concentrated on the side surface of the first region 120, and a temperature in the junction region may be decreased by allowing current to flow while being distributed. As a result, even when static electricity of greater current is introduced into the first region 120, the electrostatic discharge protection element 100 may serve as an electrostatic discharge protection element without being damaged. For example, an electrostatic discharge protection element having high electrostatic discharge robustness characteristics may be provided. Since a new current path for distributing the static current may be formed without increasing a size of the electrostatic discharge protection element 100, an electrostatic discharge protection element having improved electrostatic discharge robustness characteristics relative to width may be provided. This will be described in further detail later with reference to FIGS. 4 and 5.

It will be understood that various current paths may be formed between the first region 120, the P-well region 110, and the second region 130 to reduce or prevent current from being locally concentrated, and thus, the electrostatic discharge protection element 100 may have improved electrostatic discharge robustness characteristics.

Referring to FIG. 2A, a plurality of parasitic BJTs may be present in the electrostatic discharge protection element 100. The plurality of parasitic BJTs may include a first parasitic BJT 10, a second parasitic BJT 20, and a third parasitic BJT 30 and may be expressed as an equivalent circuit, as illustrated in FIG. 2B. As an example, each of the parasitic BJTs may have a collector provided by a drain of the electrostatic discharge protection element 100, an emitter provided by the source of the electrostatic discharge protection element 100, and a base provided by the P-well region of the electrostatic discharge protection element 100. Accordingly, the first parasitic BJT 10, the second parasitic BJT 20, and the third parasitic BJT 30 may operate as an N-P-N BJT.

The first parasitic BJT 10 may form a current path between a first N-well region 121, a P-well region 110, and a second region 130. The second parasitic BJT 20 may form a current path between a first impurity region 123, the P-well region 110, and the second region 130. The third parasitic BJT 30 may form a current path between a second N-well region 122, the P-well region 110, and the second region 130.

In the first parasitic BJT 10, the first N-well region 121 may operate as an emitter, the P-well region 110 may operate as a base, and the second region 130 may operate as a collector. In the second parasitic BJT 20, the first impurity region 123 may act as an emitter, the P-well region 110 may operate as a base, and the second region 130 may operate as a collector. In the third parasitic BJT 30, the second N-well region 122 may operate as an emitter, the P-well region 110 may operate as a base, and the second region 130 may operate as a collector.

The first parasitic BJT 10 may allow current to flow from the first N-well region 121 to the second region 130. The second parasitic BJT 20 may allow current to flow from the first impurity region 123 to the second region 130. The third parasitic BJT 30 may allow current to flow from the second N-well region 122 to the second region 130.

When the electrostatic discharge protection element 100 does not include the second N-well region 122, a current path may be formed through the first parasitic BJT 10 and the second parasitic BJT 20 to reduce or prevent static electricity. When the electrostatic discharge protection element 100 includes the second N-well region 122, the third parasitic BJT 30 may forms a new current path to reduce or prevent the current from being concentrated in the first region 120.

The electrostatic discharge protection element 100 may include a plurality of parasitic BJTs connected to each other in parallel to provide an electrostatic current path. Accordingly, when the electrostatic discharge protection element 100 does not include the second N-well region 122, the third parasitic BJT 30 may not be formed, and thus, the electrostatic current may flow while being locally concentrated in the first and second parasitic BJTs 10 and 20 to flow. According to the present inventive concepts, since the second N-well region 122 is formed in the first region 120 of the electrostatic discharge protection element 100, three parasitic BJTs may be connected in parallel to each other to distribute a stress caused by the electrostatic current.

A region, in which the first parasitic BJT 10, the second parasitic BJT 20, and the third parasitic BJT 30 are formed, is not limited to that illustrated in FIG. 1 and a location thereof may be variously changed according to example embodiments.

The electrostatic discharge protection element 100 is illustrated as a planar MOSFET, but is not limited thereto.

In some example embodiments, in the case of a FinFET in which a transistor of the internal integrated circuit 200 has a three-dimensional structure, the electrostatic discharge protection element 100 may be formed to have a FinFET structure.

In some example embodiments, in the case of a FinFET or a multi-bridge channel FET (MBCFET™) in which a transistor of the internal integrated circuit 200 has a three-dimensional structure, the electrostatic discharge protection element 100 may have a planar MOSFET structure.

In some example embodiments, the electrostatic discharge protection element 100 may be formed together during a process in which the transistor of the internal integrated circuit 200 is formed as an MBCFET™. For example, the transistor of the internal integrated circuit 200 is formed as an MBCFET™, and the electrostatic discharge protection element 100 may include semiconductor layers in which a silicon layer and a silicon-germanium layer are alternately and repeatedly stacked. For example, in the electrostatic discharge protection element 100, portions of the substrate 101 disposed below the first region 120, the second region 130, and/or the gate electrode 154 may include silicon layers in which a silicon layer and a silicon-germanium layer are repeatedly and alternately stacked.

Figure 3A:
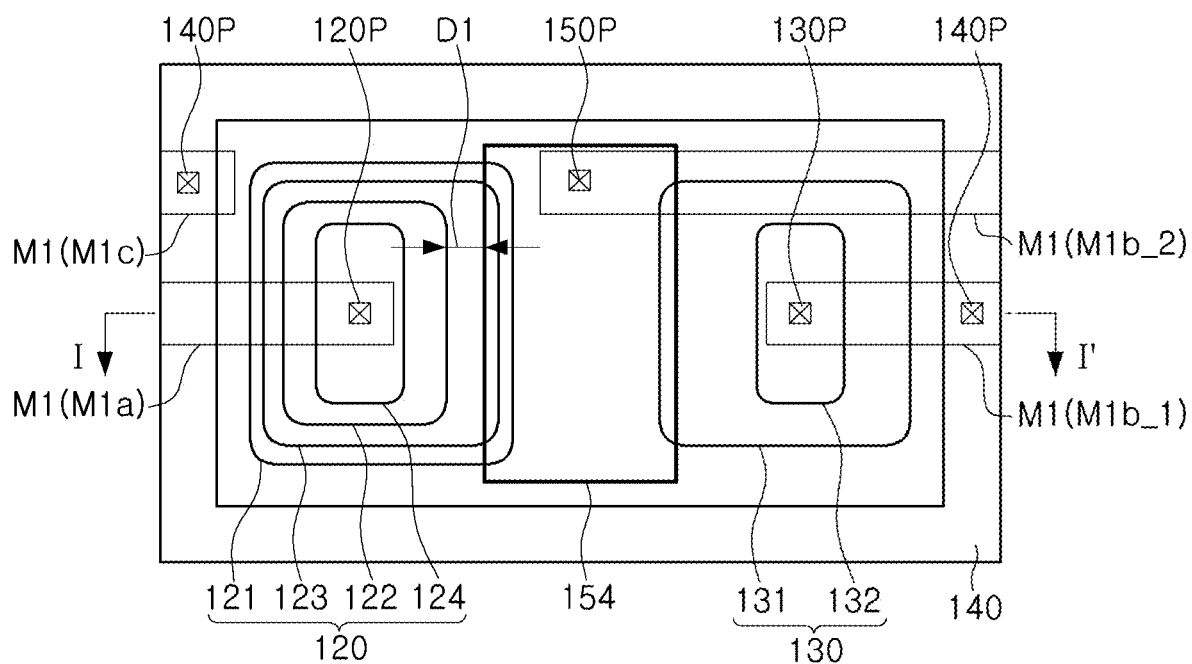
FIG. 3A is a plan view of an electrostatic discharge protection element according to example embodiments.

FIG. 3A is a plan view of an electrostatic discharge protection element according to example embodiments.

Figure 3B:
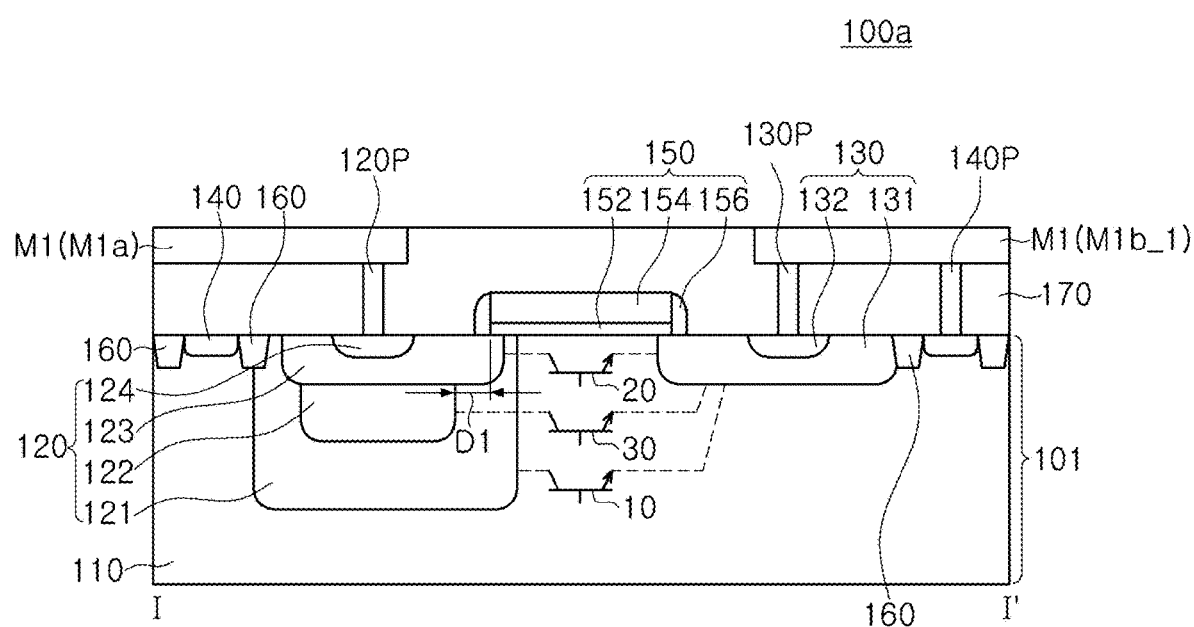
FIG. 3B is a cross-sectional view of an electrostatic discharge protection element according to example embodiments.

FIG. 3B is a cross-sectional view of an electrostatic discharge protection element according to example embodiments. FIG. 3B illustrates a cross section of the electrostatic discharge protection element, taken along line I-I' in FIG. 3A.

Referring to FIGS. 3A and 3B, an electrostatic discharge protection element 100a may include second metal lines M1*b*_1 and M1*b*_2 spaced apart from each other. The second metal lines M1*b*_1 and M1*b*_2 may include a second ground metal line M1*b*_1 and a second gate metal line M1*b*_2.

The second ground metal line M1*b*_1 may commonly connect second and third contact plugs 130P and 140P on a substrate 101. The second ground metal line M1*b*_1 may be electrically connected to a second region 130 and a P-type impurity region 140. The second ground metal line M1*b*_1 may be electrically connected to a second pad 400 (see FIG. 1) to apply a ground voltage $V_{SS}$ to the second region 130 and the P-type impurity region 140.

The second gate metal line M1*b*_2 may be electrically connected to a fourth contact plug 150P on the substrate 101. The second gate metal line M1*b*_2 may be electrically connected to a gate electrode 154 through the fourth contact plug 150P. The second gate metal line M1*b*_2 may be electrically connected to a resistor R, a capacitor C, source/drain regions of other transistors, or an inverter (see FIGS. 6A to 6C and 6E to 6G).

Figure 4:
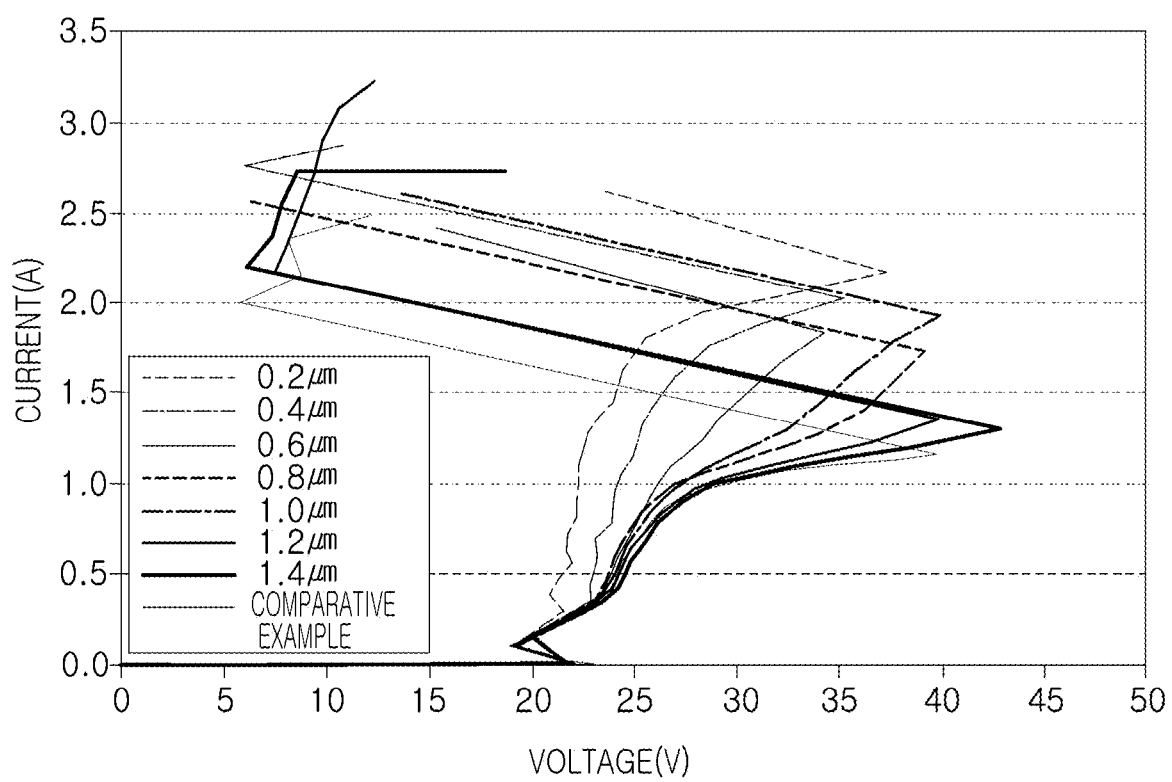
FIGS. 4 and 5 show graphs of measured voltage and current of an electrostatic discharge protection element according to example embodiments.

FIG. 4 shows a graph of measured voltage and current of an electrostatic discharge protection element according to example embodiments.

Referring to FIGS. 2A and 4, when a first distance D1 of the electrostatic discharge protection element 100 is changed, electrostatic discharge robustness characteristics of the electrostatic discharge protection element 100 may be analyzed.

Experimental examples show cases in which the first distance D1 is about 0.2 µm, about 0.4 µm, about 0.6 µm, about 0.8 µm, about 1.0 µm, about 1.2 µm, and about 1.5 µm. As a comparative example, a voltage and a current of a drain region of an electrostatic discharge protection element, not including a second N-well region 122, were measured.

In all of the experimental examples, there was a period in which a current relative to a specific voltage was increased, as compared with the comparative example. It can be seen that, by additionally forming a second N-well region 122 in a first N-well region 121, an electrostatic current path was be formed through a parasitic BJT to improve electrostatic discharge robustness characteristics of the electrostatic discharge protection element 100.

In some example embodiments, the first distance D1 may be less than about 1.5 μm. The first distance D1 may be in the range from about 0.1 μm to about 1.4 μm. The first distance D1 may be in the range from about 0.1 μm to about 0.3 μm. The first distance D1 may be in the range from about 0.15 μm to about 0.25 μm.

When the first distance D1 is in the above range, the electrostatic discharge robustness characteristics of the electrostatic discharge protection element 100 may be improved. When the first distance D1 is larger than about 1.5 μm, the third parasitic BJT 30 may not operate due to an increase in resistance. When the first distance D1 is less than about 0.1 μm, a breakdown voltage BV of a gate dielectric layer 152 may be decreased to cause an increase in leakage current.

Figure 5:
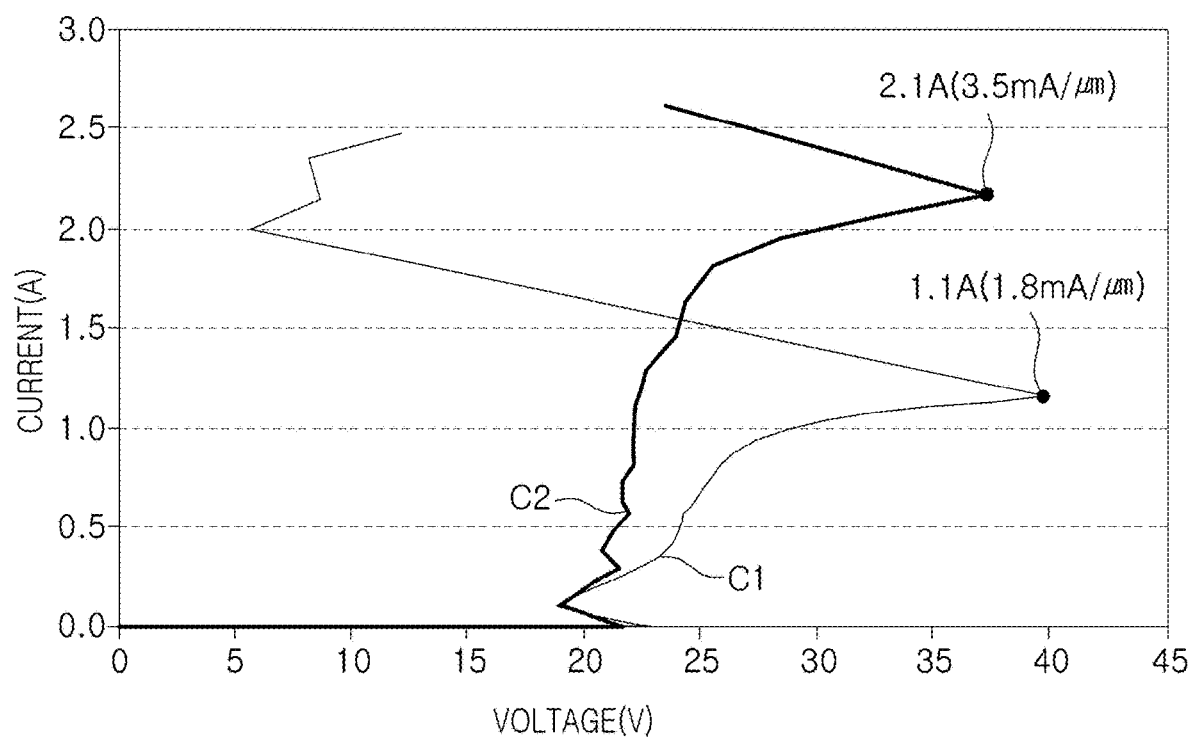

FIG. 5 is a graph showing a comparison between electrostatic discharge robustness characteristics of a comparative example of an electrostatic discharge protection element, not including a second N-well region, and an inventive example of an electrostatic discharge protection element including a second N-well region.

Referring to FIG. 5, when the electrostatic discharge protection element 100 includes the second N-well region 122, electrostatic characteristics relative to a width may be improved, as compared with the comparative example.

A first curve C1 represents an experimental result of an electrostatic discharge protection element, not including a second N-well region. It can be seen that when static electricity was generated, strong snapback was induced at an electrostatic current of about 1.1 A. In example embodiments according to the comparative example, the electrostatic discharge protection element may have an electrostatic discharge robustness characteristic of about 1.8 mA/μm, based on an overall width of the electrostatic discharge protection element.

A second curve C2 represents an experimental result of the electrostatic discharge protection element 100 including the second N-well region 122. A first distance D1 of the second N-well region 122 may be about 0.2 μm. It can be seen that when static electricity was generated, strong snapback was induced by an electrostatic current of about 2.1 A. The electrostatic discharge protection element 100 may have an electrostatic discharge robustness characteristic of about 3.5 mA/μm, based on the overall width of the electrostatic discharge protection element 100.

Due to the additional formation of the second N-well region 122, parasitic BJT may allow the electrostatic current to flow while being distributed and heat generation caused by current concentration may be reduced or prevented to decrease a temperature in a junction region. Accordingly, the electrostatic discharge protection element 100 having improved electrostatic discharge robustness characteristics may be provided. An effect of improving the electrostatic current robustness characteristics due to the third parasitic BJT 30 of the second N-well region 122 will be understood from an increase in magnitude of a current relative to the same voltage, as compared with the comparative example.

FIGS. 6A to 6G are block diagrams of semiconductor devices, each including an electrostatic discharge protection element according to example embodiments.

Figure 6A:
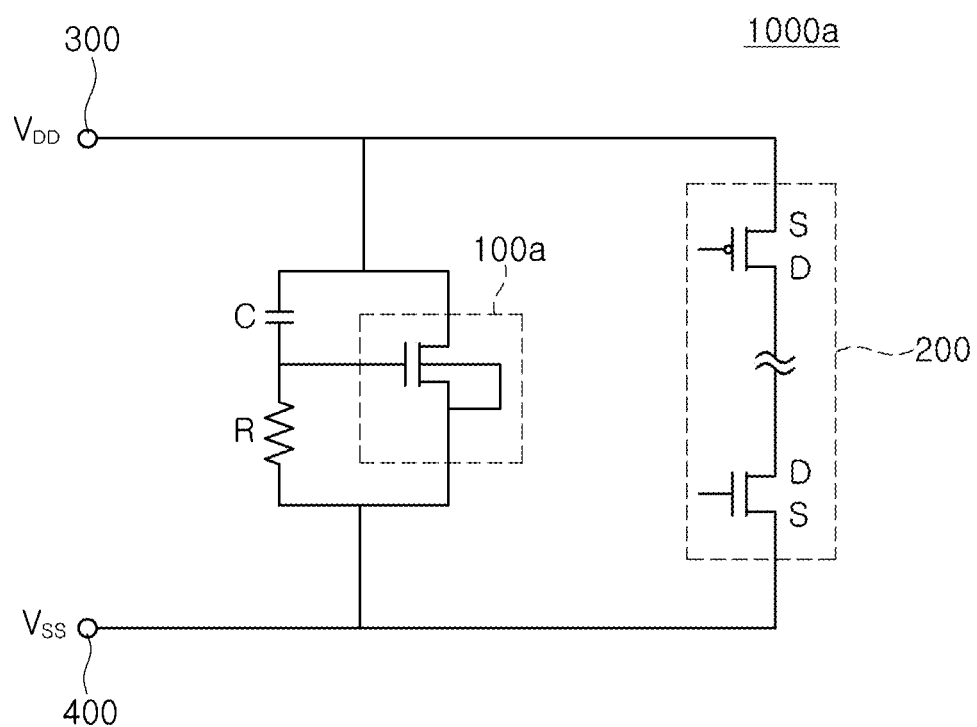
FIGS. 6A to 6G are block diagrams of semiconductor devices, each including an electrostatic discharge protection element according to example embodiments.

Referring to FIG. 6A, a semiconductor device 1000a may include an electrostatic discharge protection element 100a, an internal integrated circuit 200, a first pad 300, a second pad 400, a resistor R, and/or a capacitor C.

An RC circuit may be configured by connecting the capacitor C between a gate electrode 154 of the electrostatic discharge protection element 100a and a first pad 300 and connecting the resistor R between a gate electrode 154 of the electrostatic discharge protection element 100a and a second pad 400. The electrostatic discharge protection element 100a may have a gate-coupled NMOS (GCNMOS) structure.

When static electricity is generated, the electrostatic discharge protection element 100a may be biased through the RC circuit. After avalanche breakdown occurs at a lower voltage between a drain region and a body due to a voltage applied to the drain region, the electrostatic discharge protection element may be turned on to discharge the static electricity.

Figure 6B:
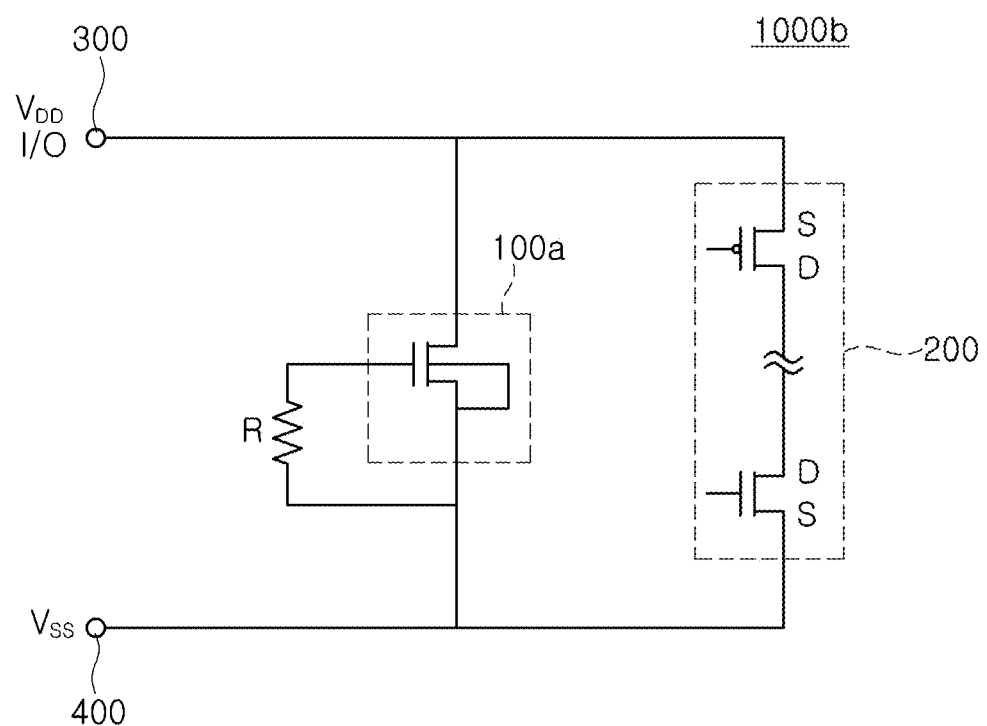

Referring to FIG. 6B, a semiconductor device 1000b may include an electrostatic discharge protection element 100a, an internal integrated circuit 200, a first pad 300, a second pad 400, and/or a resistor R. The resistor R may be connected between a gate electrode 154 of the electrostatic discharge protection element 100a and a second pad 400. The electrostatic discharge protection element 100a may have a soft-gate-coupled NMOS (SGCNMOS) structure.

Figure 6C:
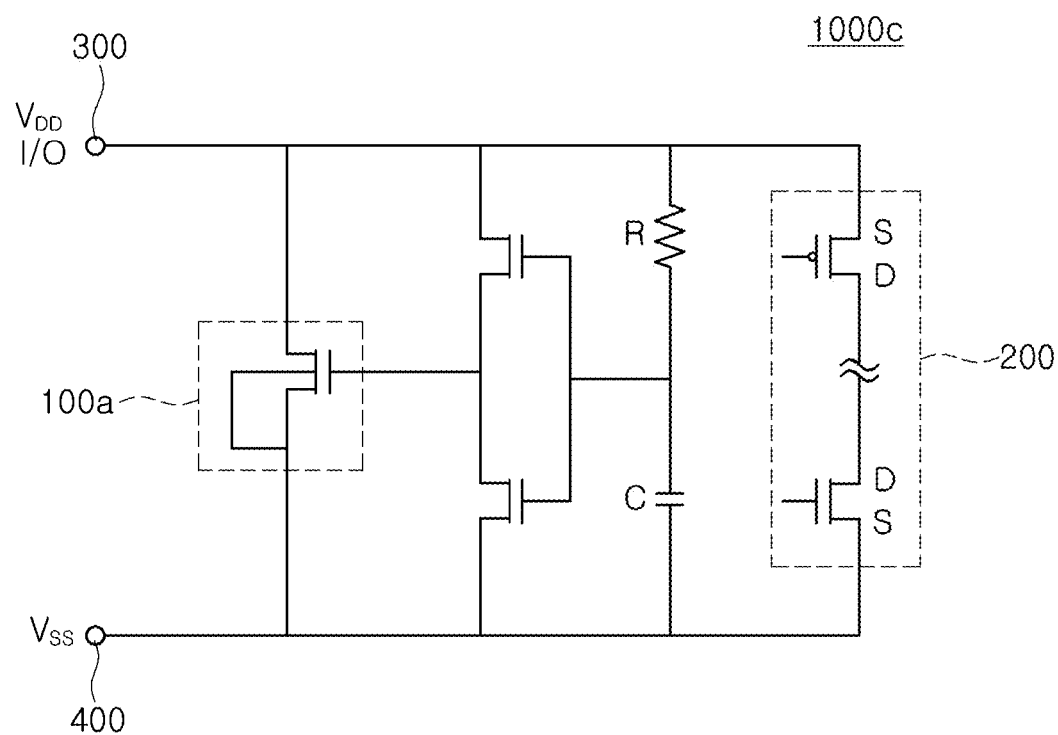

Referring to FIG. 6C, a semiconductor device 1000c may include an electrostatic discharge protection element 100a, an internal integrated circuit 200, a first pad 300, a second pad 400, an NMOS transistor, a resistor R, and/or a capacitor C.

A gate electrode of the NMOS transistor may be electrically connected to the resistor R and the capacitor C. A gate electrode 154 of the electrostatic discharge protection element 100a may be electrically connected to a source and/or drain region of the NMOS transistor.

Figure 6D:
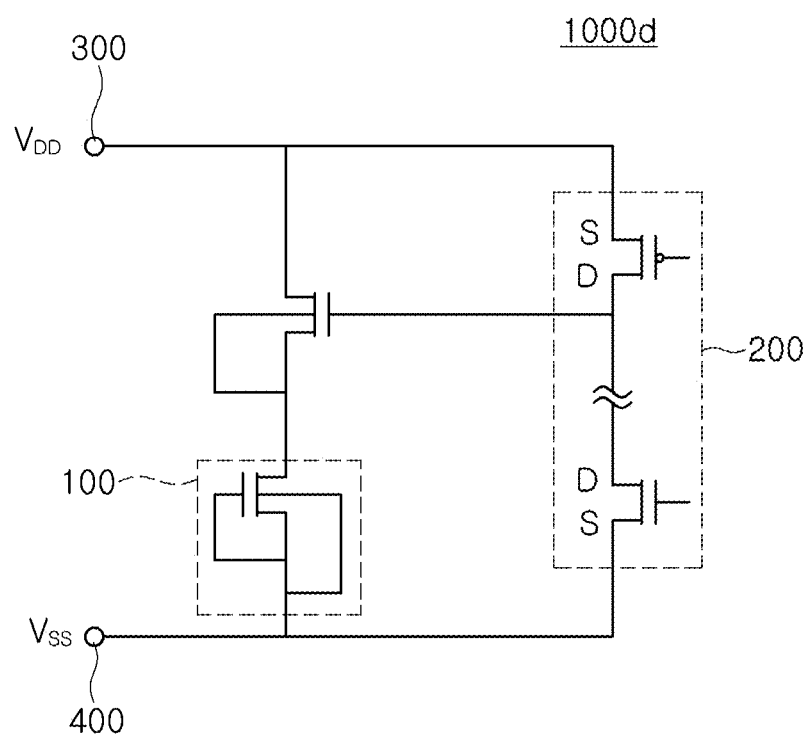

Referring to FIG. 6D, a semiconductor device 1000d may include an electrostatic discharge protection element 100, an internal integrated circuit 200, a first pad 300, a second pad 400, and/or an NMOS transistor.

Figure 6E:
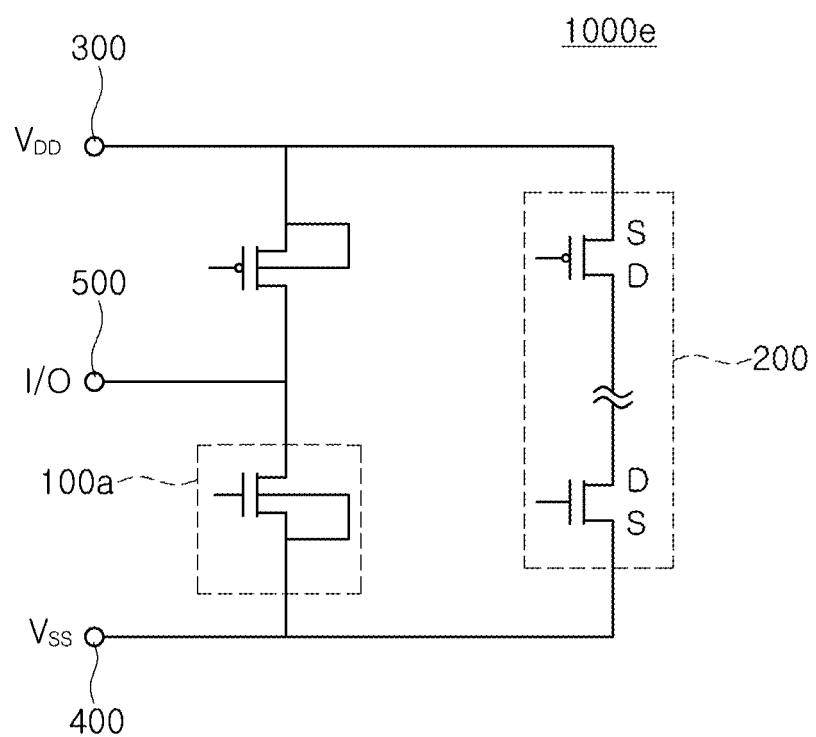

Referring to FIG. 6E, a semiconductor device 1000e may include an NMOS transistor, a PMOS transistor, an internal integrated circuit 200, a first pad 300, a second pad 400, and/or a third pad 500. The NMOS transistor may be an electrostatic discharge protection element 100a. The electrostatic discharge protection element 100a may have a gate electrode 154 in a floating state. The first pad 300 may be a power voltage pad. The second pad 400 may be a ground voltage pad. The third pad 500 may be an input/output pad.

When static electricity is generated in the first pad 300 or the third pad 500, the NMOS transistor may operate as an electrostatic discharge protection element introducing current, generated by the static electricity, into the NMOS transistor to be discharged through the second pad 400.

Figure 6F:
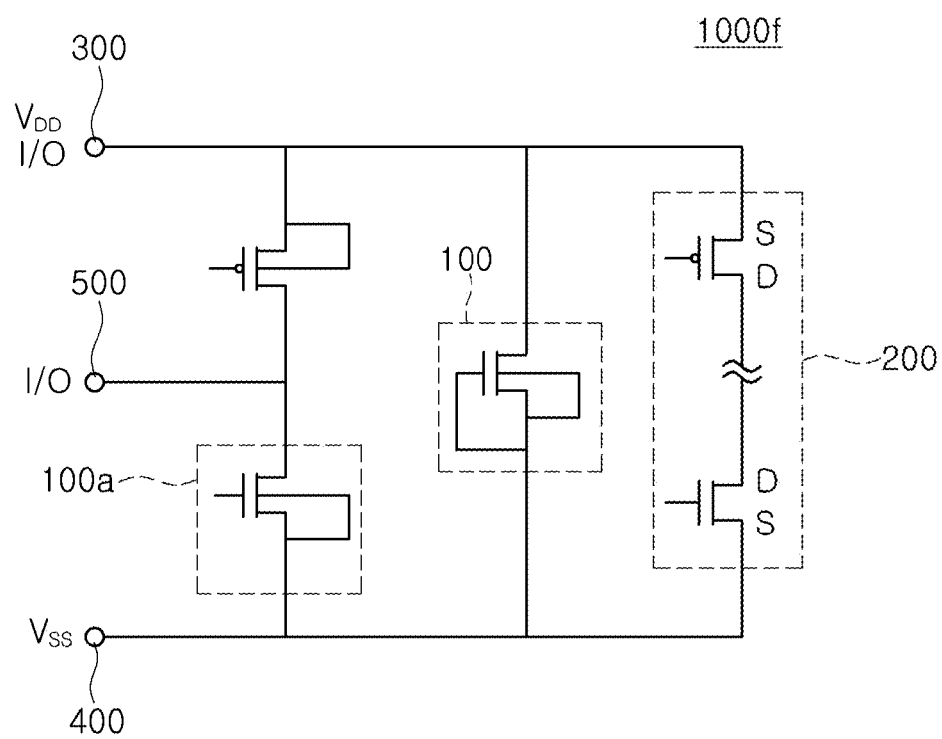

Referring to FIG. 6F, a semiconductor device 1000f may include an electrostatic discharge protection element 100, an internal integrated circuit 200, an NMOS transistor, a PMOS transistor, a first pad 300, a second pad 400, and/or a third pad 500.

The NMOS transistor may operate as an electrostatic discharge protection element 100a introducing current, generated in the third pad 500, an input/output pad, by static electricity, into a ground terminal to protect the internal integrated circuit 200.

In addition, the electrostatic discharge protection element 100 may also be connected between the first pad 300 and the second pad 400 to introduce current, generated in the first pad 300 by static electricity, into a ground terminal to protect the internal integrated circuit 200.

Figure 6G:
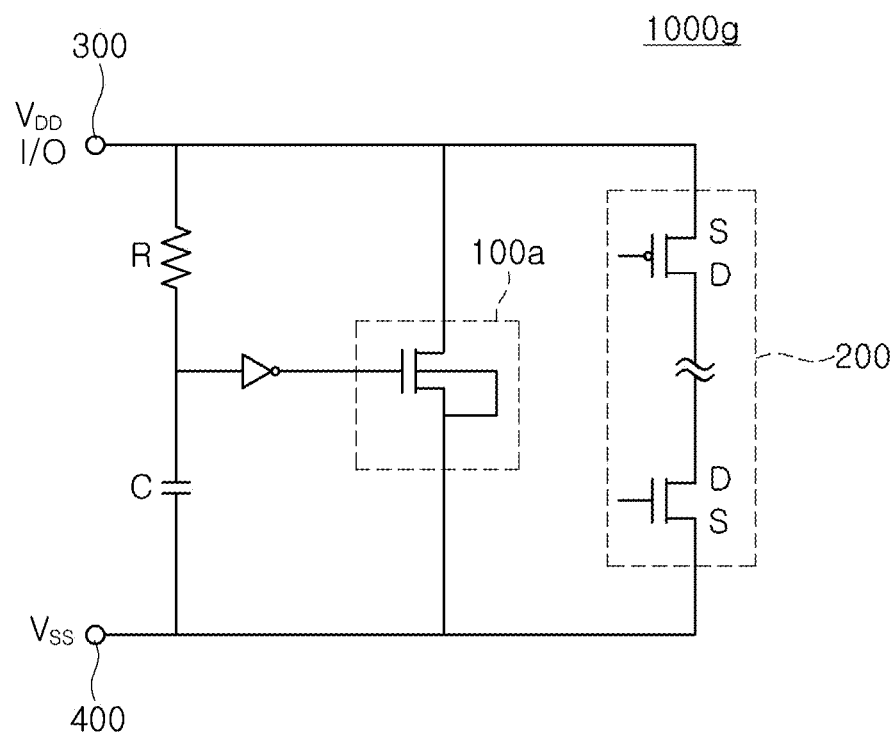

Referring to FIG. 6G, a semiconductor device 1000g may include an electrostatic discharge protection element 100a, an internal integrated circuit 200, an inverter, a resistor R, a capacitor C, a first pad 300, and/or a second pad 400.

A gate electrode 154 of the electrostatic discharge protection element 100a may be connected to an inverter.

Figure 7A:
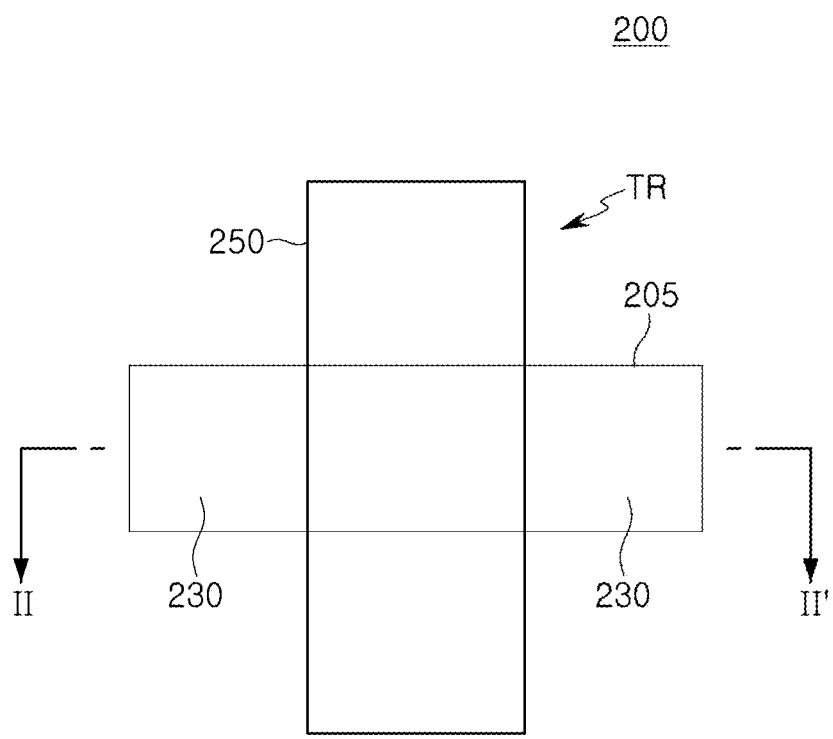
FIG. 7A is a plan view of a transistor of an internal integrated circuit of a semiconductor device according to example embodiments.

FIG. 7A is a plan view of a transistor of an internal integrated circuit of a semiconductor device according to example embodiments.

Figure 7B:
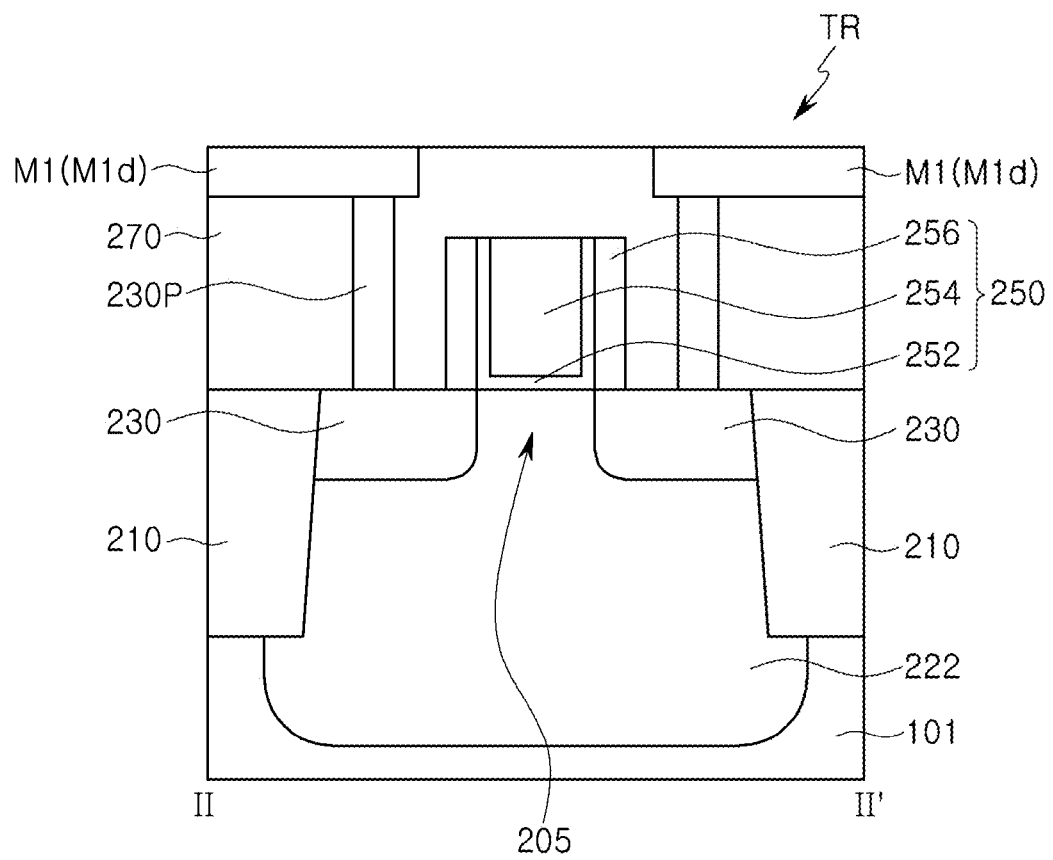
FIG. 7B is a cross-sectional view of a transistor of an internal integrated circuit of a semiconductor device according to example embodiments.

FIG. 7B is a cross-sectional view of a transistor of an internal integrated circuit of a semiconductor device according to example embodiments. FIG. 7B illustrates a cross section of the transistor, taken along line II-IT in FIG. 7A. FIGS. 7A and 7B illustrate an NMOS transistor among transistors.

Referring to FIGS. 7A and 7B, an internal integrated circuit 200 may include a plurality of transistors TR. The plurality of transistors TR may include a circuit active region 205, a circuit gate structure 250 on the circuit active region 205, a circuit gate structure 250 on the circuit active region 205, and/or circuit source/drain regions formed on opposite sides adjacent to the circuit gate electrode 254. The circuit source/drain regions 230 may be formed in a circuit N-well region 222.

The transistors TR may include an NMOS and/or a PMOS. The transistors TR may be planar MOSFETs. Each of the transistors TR may be a FinFET having an active fin structure in which an active region protrudes, and may be a multi-bridge channel FET (MBCFET™) including a plurality of channel layers vertically spaced apart from each other on the active region.

The circuit active region 205 may be disposed on a substrate 101. The substrate 101 may be the same substrate as the substrate 101 in the electrostatic discharge protection element 100 described with reference to FIG. 2B. The substrate 101 may include a P-well region 110. The circuit active region 205 may be defined by a device separation region 210. The circuit active region 205 may be disposed above the substrate 101 and below the circuit gate structure 250. According to example embodiments, the circuit active region 205 may include impurities, and at least a portion of the circuit active region 205 may include impurities of different conductivity types to each other, but the present disclosure is not limited thereto.

In some example embodiments, the circuit active region 205 may have a structure protruding from the substrate 101. An upper end of the circuit active region 205 may be disposed to protrude from an upper surface of the device separation region 210 at a predetermined or alternatively, desired height. In example embodiments, a transistor TR of the internal integrated circuit 200 may have a fin structure in the circuit active region 205, and the circuit active region 205 may be a FinFET, a transistor in which a channel region of a transistor is formed in the circuit active region 205 intersecting the circuit gate structure 250.

The circuit source/drain regions 230 may be disposed to be adjacent to the circuit active region 205 on opposite sides adjacent to the circuit gate structure 250. The circuit source/drain regions 230 may be provided as a source region or a drain region of a transistor. The circuit source/drain regions 230 may be a semiconductor layer including silicon (Si). The circuit source/drain regions 230 may include impurities of different types and/or different concentrations. For example, the circuit source/drain regions 230 may include N-type doped silicon (Si) and/or P-type doped silicon germanium (SiGe). In example embodiments, the circuit source/drain regions 230 may include a plurality of regions including elements having different concentrations and/or doped elements.

In some example embodiments, a width of the circuit source/drain regions 230 may be less than a width of the second impurity region 124 and a width of the fourth impurity region 132 of the electrostatic discharge protection element 100 (see FIG. 2B).

In some example embodiments, the circuit source/drain regions 230 may be disposed on the circuit active region 205 on opposite sides adjacent to the circuit gate structure 250. The circuit source/drain regions 230 may be disposed to cover an upper surface of the circuit active region 205 below opposite sides of the circuit gate structure 250. The circuit source/drain regions 230 may be disposed by recessing a portion of an upper portion of the circuit active region 205, but various changes may be made with respect to whether the upper portion is recessed and a recessed depth, according to example embodiments.

The circuit gate structure 250 may intersect the circuit active region 205 above the circuit active region 205 to extend in one direction. The circuit gate structure 250 may include a circuit gate electrode 254, a circuit gate dielectric layer 252 between the circuit gate electrode 254 and the circuit active region 205, and/or a circuit gate spacer 256 on side surfaces of the circuit gate electrode 254.

The circuit gate dielectric layer 252 may be disposed to cover at least a portion of surfaces of the circuit gate electrode 254. For example, the circuit gate dielectric layer 252 may be disposed to surround all surfaces, except for an uppermost surface of the circuit gate electrode 254. The circuit gate dielectric layer 252 may include an oxide, a nitride, or a high-k material.

In some example embodiments, the circuit gate dielectric layer 252 may have a thickness different from a thickness of the gate dielectric layer 152 of the electrostatic discharge protection element 100 (see FIG. 2B). For example, the circuit gate dielectric layer 252 may have a lower thickness than the gate dielectric layer 152. The circuit gate dielectric layer 252, covering the circuit active region 205, may have a smaller width than the gate dielectric layer 152 covering the substrate 101.

The circuit gate electrode 254 may be disposed on the circuit active region 205. The circuit gate electrode 254 may be spaced apart from the circuit active region 205 by the circuit gate dielectric layer 252. The circuit gate electrode 254 may include a conductive material, for example, a metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon. The circuit gate electrode 254 may have a multilayer structure including two or more layers.

The circuit gate spacer 256 may be disposed on opposite side surfaces of the circuit gate electrode 254. The circuit gate spacer 256 may insulate the circuit source/drain regions 230 and the circuit gate electrode 254 from each other. The circuit gate spacer 256 may have a multilayer structure. The circuit gate spacer 256 may be formed of an oxide, a nitride, and an oxynitride and, particularly, may be formed of a low-k material.

The circuit N-well region 222 may have N-type conductivity. The circuit N-well region 222 may be formed by implanting N-type impurities into one region of the P-well region 110 of the substrate 101.

In some example embodiments, the circuit N-well region 222 may be a well region formed to correspond to the first N-well region 121 and/or the second N-well region 122 of the electrostatic discharge protection element 100. A maximum depth of the circuit N-well region 222 may be substantially the same as a maximum depth of the second N-well region 122, but the present disclosure is not limited thereto.

In some example embodiments, a doping concentration of the circuit source/drain regions 230 may be greater than a doping concentration of the circuit N-well region 222. An impurity concentration of the circuit N-well region 222 may be increased in a direction toward an upper surface of the substrate 101. The circuit N-well region 222 may include a plurality of regions having different doping concentrations to each other.

The circuit source/drain regions 230 may be formed in the circuit N-well region 222. The circuit N-well region 222 may overlap the circuit source/drain regions 230 in a vertical direction.

In some example embodiments, the circuit N-well region 222 may provide a deep junction region. The deep junction region may extend downwardly of a lower portion of the circuit gate structure 250 and a lower portion of the device separation region 210.

A transistor TR of the internal integrated circuit 200 may further include a circuit interlayer insulating layer 270, circuit contact plugs 230P electrically connected to the circuit source/drain regions 230 through the circuit interlayer insulating layer 270, and circuit metal lines M1d electrically connected to the circuit contact plugs 230P.

The circuit interlayer insulating layer 270 may be disposed to cover upper surfaces of the circuit source/drain regions 230, the device separation region 210, and the circuit gate structure 250. The circuit interlayer insulating layer 270 may include, for example, at least one of an oxide, a nitride, and an oxynitride and may include a low-k material.

The circuit contact plugs 230P may be electrically connected to the circuit source/drain regions 230, respectively. At least a portion of the circuit contact plugs 230P may be connected to a circuit source region, among the circuit source/drain regions 230, and the circuit metal line M1d electrically connected thereto may be electrically connected to the second metal line M1b of the electrostatic discharge protection element 100 to be electrically connected to the second region 130.

In some example embodiments, when a transistor TR of the internal integrated circuit 200 is a PMOS, a circuit source region S (see FIG. 1) may be electrically connected to the first region 120 through the circuit contact plug 230P and the first metal line M1a of the electrostatic discharge protection element 100.

The circuit metal lines M1d may be disposed on the circuit contact plugs 230P and may extend in one direction.

As described above, an electrostatic discharge (ESD) protection device, which may more uniformly distribute discharge current to decrease a temperature of a junction portion and may implement improved ESD robustness characteristics even with a small area, and a semiconductor device including the ESD protection device may be provided.

While example embodiments have been shown and described above, it will be apparent to those skilled in the art that modifications and variations could be made without departing from the scope of the present inventive concepts as defined by the appended claims.

What is claimed is:

1. A semiconductor device comprising:
a substrate;
a separation region in the substrate;
an electrostatic discharge protection element;
an internal integrated circuit electrically connected to the electrostatic discharge protection element; and
a first pad and a second pad electrically connected to the electrostatic discharge protection element and the internal integrated circuit,
wherein the electrostatic discharge protection element comprises:
a P-well region in the substrate;
a gate structure including a gate electrode having a first side surface and a second side surface, opposing each other, on the substrate, a gate spacer, and a gate dielectric layer between the gate electrode and the substrate;
a first region adjacent to the first side surface of the gate electrode in the substrate;
a second region adjacent to the second side surface of the gate electrode in the substrate; and
a first contact plug electrically connected to the first region, and wherein
the first region and the second region have N-type conductivity,
the first region includes a first N-well region in the substrate, a second N-well region in the first N-well region, a first impurity region overlapping the second N-well region in the first N-well region in a vertical direction, and a second impurity region nested in the first impurity region, the second impurity region having a smaller width than the first impurity region, the first impurity region having a top surface extending flat from an edge of the second impurity region to an outer edge of the first impurity region, the top surfaces of the first and second impurity regions being coplanar,
the first N-well region, the second N-well region, the first impurity region, and the second impurity region have different doping concentrations,
the second region includes a third impurity region in the substrate and a fourth impurity region in the third impurity region,
the vertical direction is perpendicular to an upper surface of the substrate,
a distance between the upper surface of the substrate and a lower surface of the second N-well region is greater than a distance between the upper surface of the substrate and a lower surface of the separation region,
the first contact plug is in contact with the second impurity region in the first region, and
the gate electrode overlaps the first impurity region and not the second impurity region when viewed from above.

2. The semiconductor device of claim 1, wherein a doping concentration of the second impurity region is greater than a doping concentration of the first impurity region and a doping concentration of the second N-well region.

3. The semiconductor device of claim 1, wherein a doping concentration of the second N-well region is greater than a doping concentration of the first N-well region.

4. The semiconductor device of claim 1, wherein one side surface of the second N-well region adjacent to the gate electrode is spaced apart from the first side surface of the gate electrode adjacent to the second N-well region in a horizontal direction by a first distance, when viewed from above, and the horizontal direction is parallel to the upper surface of the substrate.

5. The semiconductor device of claim 4, wherein the first distance is less than 1.5 µm.

6. The semiconductor device of claim 4, wherein the first distance is in a range from 0.1 µm to 0.3 µm.

7. The semiconductor device of claim 4, wherein the first N-well region has a larger width than the second N-well region.

8. The semiconductor device of claim 1, wherein a distance between the upper surface of the substrate and a lower surface of the first N-well region is greater than a distance between the upper surface of the substrate and the lower surface of the separation region, and a portion of the first N-well region overlaps the separation region in the vertical direction.

9. The semiconductor device of claim 1, wherein the electrostatic discharge protection element further comprises:

a first parasitic BJT in which the first N-well region operates as an emitter, the P-well region operates as a base, and the second region operates as a collector;

a second parasitic BJT in which the first impurity region operates as an emitter, the P-well region operates as a base, and the second region operates as a collector; and a third parasitic BJT in which the second N-well region operates as an emitter, the P-well region operates as a base, and the second region operates as a collector.

10. The semiconductor device of claim 1, wherein the electrostatic discharge protection element further comprises:

a P-type impurity region surrounding the first region and the second region;

a second contact plug electrically connected to the second region;

a third contact plug electrically connected to the P-type impurity region;

a fourth contact plug electrically connected to the gate electrode;

a first metal line on the first contact plug and electrically connected to the first region through the first contact plug; and a second metal line commonly connecting the second to fourth contact plugs and applying a ground voltage to the second region, the P-type impurity region, and the gate electrode through the second to fourth contact plugs, the first metal line is electrically connected to the first pad, the second metal line is electrically connected to the second pad, a depth of the first region from the upper surface of the substrate is larger than a depth of the second region from the upper surface of the substrate, a depth of the third impurity region from the upper surface of the substrate is less than a depth of the second N-well region from the upper surface of the substrate, and the second contact plug is in contact with the fourth impurity region in the second region.

11. The semiconductor device of claim 10, wherein the internal integrated circuit includes a plurality of transistors, each of the plurality of transistors includes a circuit active region, a circuit gate electrode on the circuit active region, a circuit gate dielectric layer between the circuit gate electrode and the substrate, and circuit source/drain regions on the circuit active region on opposite sides adjacent to the circuit gate electrode, the plurality of transistors include a first transistor, a circuit gate electrode of the first transistor has a smaller width than a width of the gate electrode of the electrostatic discharge protection element, and a circuit gate dielectric layer of the first transistor has a smaller thickness than a thickness of the gate dielectric layer of the electrostatic discharge protection element.

12. The semiconductor device of claim 11, wherein a circuit source region among the circuit source/drain regions of the internal integrated circuit is electrically connected to the second region of the electrostatic discharge protection element through the second metal line.

13. The semiconductor device of claim 11, wherein a width of each of the circuit source/drain regions of the internal integrated circuit is less than a width of the second impurity region and a width of the fourth impurity region of the electrostatic discharge protection element.

14. The semiconductor device of claim 11, wherein the circuit source/drain regions of the internal integrated circuit are in a circuit N-well region, and a maximum depth of the circuit N-well region is the same as a maximum depth of the second N-well region.

15. A semiconductor device comprising:

a substrate including a P-well region;

a gate structure including a gate electrode on the substrate, a gate spacer, and a gate dielectric layer between the gate electrode and the substrate;

a first region and a second region formed in the substrate on opposite sides adjacent to the gate electrode; and a first contact plug electrically connected to the first region, wherein the first region includes a first N-well region in the substrate and a second N-well region, a first impurity region, and a second impurity region nested in the first N-well region, the second impurity region having a smaller width than the first impurity region, the first impurity region having a top surface extending flat from an edge of the second impurity region to an outer edge of the first impurity region, the top surfaces of the first and second impurity regions being coplanar, the first N-well region, the second N-well region, the first impurity region, and the second impurity region have different doping concentrations, the second region includes a third impurity region in the substrate and a fourth impurity region in the third impurity region, a doping concentration of the second N-well region is greater than a doping concentration of the first N-well region, a doping concentration of the second impurity region is greater than a doping concentration of the second N-well region, the first contact plug is in contact with the second impurity region in the first region, and the gate structure overlaps the first impurity region and not the second impurity region when viewed from above.

16. The semiconductor device of claim 15, wherein the second N-well region does not overlap the gate electrode in a vertical direction, and the vertical direction is perpendicular to an upper surface of the substrate.

17. The semiconductor device of claim 15, wherein one side surface of the second N-well region adjacent to the gate electrode is spaced apart from one side surface of the gate electrode adjacent to the second N-well region in a horizontal direction by a first distance, when viewed from above, the horizontal direction is parallel to an upper surface of the substrate, and the first distance is in a range from 0.1 µm to 1.4 µm.

18. The semiconductor device of claim 15, further comprising:
a second contact plug electrically connected to the fourth impurity region;
a third contact plug electrically connected to the P-well region;
a fourth contact plug electrically connected to the gate electrode;
a first metal line electrically connected to the second impurity region through the first contact plug and extending in one direction on the substrate; and
a second metal line electrically connected to the fourth impurity region and the P-well region through the third and fourth contact plugs and extending in the one direction on the substrate.

19. A semiconductor device comprising:
an electrostatic discharge protection element; and
an internal integrated circuit electrically connected to the electrostatic discharge protection element,
wherein the electrostatic discharge protection element comprises:
a P-well region in a substrate;
a gate structure including a gate electrode on the substrate, a gate spacer, and a gate dielectric layer between the gate electrode and the substrate;
a first region and a second region formed in the substrate on opposite sides adjacent to the gate electrode; and
a first contact plug electrically connected to the first region,
the first region includes a first N-well region in the substrate and a second N-well region, a first impurity region, and a second impurity region nested in the first impurity region, the second impurity region having a smaller width than the first impurity region, the first impurity region having a top surface extending flat from an edge of the second impurity region to an outer edge of the first impurity region, the top surfaces of the first and second impurity regions being coplanar,
the first N-well region, the second N-well region, the first impurity region, and the second impurity region have different doping concentrations,
the second region includes a third impurity region in the substrate and a fourth impurity region in the third impurity region,
the electrostatic discharge protection element includes a plurality of parasitic BJTs,
wherein in the plurality of parasitic BJTs, the P-well region operates as a base and the second region operates as a collector, and
wherein the plurality of parasitic BJTs comprise:
at least one first parasitic BJTs allowing current to flow from the first N-well region to the second region by operating the first N-well region as a collector;
at least one second parasitic BJTs allowing current to flow from the first impurity region to the second region by operating the first impurity region as a collector;
at least one third parasitic BJTs allowing current to flow from the second N-well region to the second region by operating the second N-well region as a collector,
the first contact plug is in contact with the second impurity region in the first region, and
the gate structure overlaps the first impurity region and not the second impurity region when viewed from above.

20. The semiconductor device of claim 19, wherein a doping concentration of the first impurity region is greater than a doping concentration of the second N-well region,
the doping concentration of the second N-well region is greater than a doping concentration of the first N-well region,
one side surface of the first impurity region adjacent to the gate electrode is spaced apart from the second region by a first distance, and
one side surface of the second N-well region adjacent to the gate electrode is spaced apart from the second region by a second distance larger than the first distance.

* * * * *